United States Patent [19]

Fukumoto

[11] Patent Number: 5,396,461
[45] Date of Patent: Mar. 7, 1995

[54] NON-VOLATILE DYNAMIC RANDOM ACCESS MEMORY DEVICE

[75] Inventor: Katsumi Fukumoto, Nara, Japan

[73] Assignee: Sharp Kabushiki Kaisha, Osaka, Japan

[21] Appl. No.: 264,180

[22] Filed: Jun. 22, 1994

Related U.S. Application Data

[63] Continuation of Ser. No. 3,978, Jan. 15, 1993, abandoned.

[30] Foreign Application Priority Data

Jan. 16, 1992 [JP] Japan .................................. 4-5815
Feb. 5, 1992 [JP] Japan .................................. 4-20244

[51] Int. Cl.$^6$ .............................................. G11C 13/00
[52] U.S. Cl. ........................ 365/189.01; 365/230.01; 365/222; 365/149
[58] Field of Search ............... 365/181.01, 222, 230.01, 365/230.05, 230.06, 230.08, 149, 189.04

[56] References Cited

U.S. PATENT DOCUMENTS 5,181,188 1/1993 Yamauchi et al. .................. 365/149

FOREIGN PATENT DOCUMENTS 3-5996 1/1991 Japan .

OTHER PUBLICATIONS

Nikkei Microdevices; Technology/Update, "High-dielectric-constant/ferroelectric memory materials with sufficient electric characteristics and reliability data; searching for optimum materials and methods for producing films that are suitable for practical devices" (Jun. 1991, pp. 78–86.
Matsukuma, S., "Ferroelectric random access memory device; as they currently are and how they will be"*Gekkan Semiconductor World* (May 1990), pp. 118–125.
U.S. Patent Application Ser. No. 07/694,289 (filed Apr. 30, 1991).

Primary Examiner—Terrell W. Fears
Attorney, Agent, or Firm—Morrison & Foerster

[57] ABSTRACT

A non-volatile dynamic random access memory device which includes a memory section including at least non-volatile memory cells for a non-volatile mode operation which includes a recall operation and a store operation; and a rewriting device for rewriting data when the power is turned on. The data is identical with data stored in the memory section.

11 Claims, 11 Drawing Sheets

NON-VOLATILE DYNAMIC RANDOM ACCESS MEMORY DEVICE

This application is a continuation of application Ser. No. 08/003,978, filed Jan. 15, 1993, now abandoned.

BACKGROUND OF THE INVENTION

1. Field of the Invention

The present invention relates to a non-volatile dynamic random access memory (hereinafter, referred to as NV-DRAM) device, for example, to an NV-DRAM device having a volatile operation mode and a non-volatile operation mode, and to another NV-DRAM device having only a non-volatile operation mode.

2. Description of the Related Art

NV-DRAM devices are divided into two types: (a) a memory device having memory cells formed of a ferroelectric material for performing writing and reading by polarity inversion of the ferroelectric material (described in Nikkei Microdevices, June 1991, pp. 78-86); and (b) a memory device having a volatile operation mode and a non-volatile operation mode.

The memory device of (b) is divided into two types depending on the material used. One is a memory device having memory cells, each of which includes a DRAM unit (for the volatile operation mode) and an EEPROM (electrically erasable programmable read only memory) unit (for the non-volatile operation mode). Such a device performs the volatile mode operation and the non-volatile mode operation. The other is a memory device which has memory cells formed of a ferroelectric material and is performed in different operation modes depending on whether the polarity of the ferroelectric material is inverted or not inverted. In the case where the polarity is not inverted, the volatile mode operation is performed, and in the case where the polarity is inverted, the non-volatile mode operation is performed.

The former is described in detail in U.S. patent application Ser. No. 07/549,293, and the latter is described in Nikkei Microdevices, June 1991, pp. 78-86.

In practice, a volatile operation mode refers to DRAM operations including reading, writing and refreshing operations; and a non-volatile operation mode refers to a recall operation and a store operation.

FIG. 9 is a block diagram of a conventional NV-DRAM device 100 having a volatile operation mode and a non-volatile operation mode.

The NV-DRAM device 100 includes, as input pins, a Vcc pin, an $\overline{NE}$ pin (an enable pin for switching the NV-DRAM device 100 to a non-volatile mode), a $\overline{CE}$ (chip enable) pin, an $\overline{OE}$ (output enable) pin, and a $\overline{We}$ (write enable) pin. A usual memory operation and a recall operation shown in FIG. 10 are performed by way of control signals sent to the input pins from a microprocessor.

FIG. 10 is a timing chart: for the recall operation. A voltage Vcc is applied from a power supply to the Vcc pin, and a LOW signal is inputted to the $\overline{NE}$ pin at a timing shown in FIG. 10. While the signal at the $\overline{NE}$ pin is kept LOW (namely, for 10 ms), the recall operation is performed for all bits. Upon completion of the recall operation, a HIGH signal is inputted to the $\overline{NE}$ pin to reset the NV-DRAM device 100 in the recall state.

To the $\overline{CE}$ pin, the $\overline{OE}$ pin, and the $\overline{WE}$ pin, signals are inputted in waveforms shown in FIG. 10.

A period during which data is stored in an EEPROM unit of each memory cell depends on the amount of charges leaked from the floating gate of the memory cell. Accordingly, an attempt to securely store the data for a long period of time, for example, ten years, inevitably results in a decline in the production yield.

In a memory device having memory cells formed of a ferroelectric material, data can be stored for approximately one year, currently. An attempt to extend the period to ten years also results in a decline in the production yield. (An NV-DRAM device utilizing the polarity inversion of a ferroelectric material is described in detail in Nikkei Microdevices, June 1991, pp. 78-86 and in Gekkan Semiconductor World, May 1990, pp. 118-125.)

As is apparent from the above description, both types of conventional memory devices mentioned above have problems in the production yield and improvement in reliability of data.

Another example of an NV-DRAM device having memory cells, each including a non-volatile unit and a volatile unit has been proposed by the applicant of the present invention in Japanese Patent Application No. 2-202958.

FIG. 11 is a block diagram of the NV-DRAM device described in the above application. Since an overall construction of the NV-DRAM device described in the above application is similar to NV-DRAM devices according to the present invention, FIG. 11 will also be used in the description of examples of the present invention. The NV-DRAM device includes a memory array 1, a read/write timing circuit 4, a recall timing circuit 5, a store timing circuit 6, and an input circuit 11. The input circuit 11 changes the potential when receiving a signal from an external apparatus. The NV-DRAM device further includes a recall/store logic circuit 9 and a recall/store latch circuit 10 both as operation state holding means, and a power supply voltage monitoring circuit 12.

The memory array 1 includes a plurality of memory cells arranged on a chip, the memory cells each including a combination of a DRAM unit 1a and an EEPROM unit 1b. The read/write timing circuit 4 receives a $\overline{CE}$ (chip enable) signal, an $\overline{NE}$ (non-volatile enable) signal, an $\overline{OE}$ (output enable) signal, and a $\overline{WE}$ (write enable) signal from the external apparatus through the input circuit 11, and performs a reading, writing or refreshing operation of data in the DRAM units 1a of the memory cells of the memory array 1 sequentially in accordance with the level (HIGH or LOW) of the signals.

For which memory cell the read/write timing circuit 4 performs the reading, writing or refreshing operation is designated by an address counter 8 updated by a timer 7 or an external address (not shown; for example, an external address pad). In practice, in the state where a REC (recall enable) signal and an STR (store enable) are not latched by the recall/store latch circuit 10, if the $\overline{CE}$ signal is LOW, the $\overline{OE}$ signal is LOW, and the $\overline{WE}$ signal is HIGH, the reading operation is performed. If the $\overline{CE}$ signal is LOW, the $\overline{OE}$ signal is HIGH, and the $\overline{WE}$ signal is LOW, the writing operation is performed. If the $\overline{CE}$ signal is LOW, the $\overline{OE}$ signal is HIGH, and the $\overline{WE}$ signal is HIGH, the refreshing operation is performed.

In the state where the REC signal is latched by the recall/store latch circuit 10, if the $\overline{CE}$ signal is HIGH, and the $\overline{OE}$ signal is LOW, the recall timing circuit 5 sequentially performs the recall operation of the data in the memory cells of the memory array 1. The recall operation is performed page by page. Namely, data in the memory cells connected to one word line addressed by the address counter 8 are recalled at a time.

The store timing circuit 6 receives the STR signal from the recall/store latch circuit 10, and performs a store operation of data simultaneously in all the memory cells of the memory array 1 based on a generation timing of the STR signal. Upon completion of the store operation, the store timing circuit 6 sends a store operation termination pulse $\phi_2$ to the recall/store latch circuit 10.

The power supply voltage monitoring circuit 12 sends a power-on detection pulse $\phi_1$ to the recall/store latch circuit 10 when the power is turned on. The power-on detection pulse $\phi_1$ indicates that the recall operation should be performed. When the power supply voltage is decreased to a specified value or lower (including when the power is off), the power supply voltage monitoring circuit 12 sends a power-off detection pulse $\phi_3$ to the recall/store latch circuit 10. The power-off detection pulse $\phi_3$ indicates that the store operation should be performed. The power supply voltage monitoring circuit 12 has, for example, a configuration as shown in FIG. 12.

As is shown in FIG. 12, NMOS transistors 161 and 162 and a resistance 163 are connected in series between the power supply and the ground. A resistance 164 and an NMOS transistor 165 are connected in series between the power supply and the ground. Further, a junction point $J_1$ of the NMOS transistor 162 and the resistance 163 is connected to a gate of the NMOS transistor 165, and a junction point $J_2$ of the resistance 164 and the NMOS transistor 165 is connected to an inverter 166, which is connected to an inverter 167 in series.

In the above-mentioned configuration, when the power is off, the transistor 165 is also off, and the potential of the junction point $J_2$ is at the ground level. When the power is turned on from such a state, the potential of the junction point $J_2$ is raised immediately. Subsequently, the NMOS transistors 161 and 162 are turned on, thereby raising the potential of the junction point $J_1$. Accordingly, the NMOS transistor 165 is turned on, thereby lowering the potential of the junction point $J_2$ to the ground level. Thus, the power-on detection pulse $\phi_1$ is sent to the recall/store latch circuit 10 through the inverters 166 and 167.

Again with reference to FIG. 11, the recall/store logic circuit 9 receives the $\overline{CE}$ signal, the $\overline{NE}$ signal, the $\overline{OE}$ signal, and the $\overline{WE}$ signal from the external apparatus through the input circuit 11. When the $\overline{CE}$ signal is HIGH, the $\overline{NE}$ signal is LOW, the $\overline{OE}$ signal is HIGH, and the $\overline{WE}$ signal is LOW, the recall/store logic circuit 9 sends a store operation initiation signal $\phi_4$ to the recall/store latch circuit 10. The store operation initiation signal $\phi_4$ indicates that the store operation should be initiated.

When the $\overline{CE}$ signal is LOW, the $\overline{NE}$ signal is HIGH, the $\overline{OE}$ signal is HIGH, and the $\overline{WE}$ signal is HIGH, the recall/store logic circuit 9 sends a recall latch reset signal $\phi_5$ to the recall/store latch circuit 10. The recall latch reset signal $\phi_5$ indicates that the recall operation should be terminated. When the $\overline{CE}$ signal is HIGH, the $\overline{NE}$ signal is LOW, the $\overline{OE}$ signal is LOW, and the $\overline{WE}$ signal is HIGH, the recall/store logic circuit 9 sends a recall latch set signal $\phi_6$ to the recall/store latch circuit 10. The recall latch set signal $\phi_6$ indicates that the recall operation should be initiated. The signals $\phi_4$, $\phi_5$, and $\phi_6$ are relatively short, pulse-like signals.

FIG. 13 is a detailed diagram of the recall/store latch circuit 10. The recall/store latch circuit 10 includes a store latch section 110 and a recall latch section 130. A detailed configuration and operation of each section will be described, hereinafter.

In the store latch section 110, inverters 113 and 114 are connected in inverse parallel to each other. An NMOS transistor 111 and an NMOS transistor 112 are connected in parallel between a junction point $J_3$ of the inverters 113 and 114 and the ground. The NMOS transistors 111 and 112 are driven by the power-on detection pulse $\phi_1$ and the store operation termination pulse $\phi_2$ respectively. NMOS transistors 115 and 116 are connected in parallel between a junction point $J_4$ of the inverter 114 and another inverter 119 and the ground. The NMOS transistor 115 is driven by the power-off detection pulse $\phi_3$ through a pulse generating circuit 117, and the NMOS transistor 116 is driven by the store operation initiation signal $\phi_4$ through a pulse generating circuit 118.

The junction point $J_4$ is connected to an output terminal $T_1$ of the store latch section 110 through the inverter 119, a NAND circuit 121 and an inverter 122. When the power-on detection pulse $\phi_1$ or the store operation termination pulse $\phi_2$ is inputted, the inverters 113 and 114 respectively maintain the potential at the junction point $J_3$ at the ground level and the potential at the junction point $J_4$ at the Vcc level. When the power-off detection pulse $\phi_3$ or the store operation initiation signal $\phi_4$ is inputted, the inverters 113 and 114 respectively maintain the potential at the junction point $J_3$ at the Vcc level and the potential at the junction point $J_4$ at the ground level.

The NAND circuit 121 receives the potential at the junction point $J_4$ inverted by the inverter 119, and also receives the REC signal, from the recall latch section 130, inverted by an inverter 120. Accordingly, only when the REC signal is not outputted (at the LOW level) from the recall latch section 130, the store latch section 110 can maintain the STR signal at the output terminal $T_1$ (at the HIGH level).

In the recall latch section 130, inverters 139 and 140 are connected in inverse parallel to each other. NMOS transistors 137 and 138 are connected in parallel between a junction point $J_5$ of the inverters 139 and 140 and the ground. The NMOS transistor 137 is driven by the recall latch reset signal $\phi_5$ through a pulse generating circuit 135, and the NMOS transistor 138 is driven by the store operation initiation signal $\phi_4$ through a pulse generating circuit 136. An NMOS transistor 141, an NMOS transistor 142 and an NMOS transistor 143 are connected between a junction point $J_6$ of the inverter 139 and an inverter 134 and the ground. The NMOS transistor 141, the NMOS transistor 142, and the NMOS transistor 143 are driven by the store operation termination pulse $\phi_2$, the power-on detection pulse $\phi_1$ and the recall latch set signal $\phi_6$, respectively.

The junction point $J_6$ is connected to an output terminal $T_2$ of the recall latch section 130 through the inverter 134, a NAND circuit 132 and an inverter 131. When the recall latch reset signal $\phi_5$ or the store operation initiation signal $\phi_4$ is inputted, the inverters 139 and 140 respectively maintain the potential at the junction point $J_5$ at the ground level and the potential at the junction point $J_6$ at the Vcc level. When the store operation termination pulse $\phi_2$, the power-on detection pulse $\phi_1$, or the recall latch set signal $\phi_6$ is inputted, the inverters 139 and 140 respectively maintain the potential at the junction point $J_5$ at the Vcc level and the potential at the junction point $J_6$ at the ground level.

The NAND circuit 132 receives the potential at the junction point $J_6$ inverted by the inverter 134, and also receives the STR signal, from the store latch section 110, inverted by an inverter 133. Accordingly, only when the STR signal is not outputted (at the LOW level) from the store latch section 110, the recall latch section 130 can maintain the REC signal at the output terminal $T_2$ (at the HIGH level).

As is shown in FIG. 11, the REC signal and the STR signal are outputted to the recall timing circuit 5 and the store timing circuit 6, respectively, without inversion, and are also outputted to the read/write timing circuit 4 through inverters 20 and 21. Accordingly, either one of the three timing circuits, namely, the store timing circuit 6, the recall timing circuit 5, and the read/write timing circuit 4 is allowed to operate depending on whether the REC signal is maintained at the output terminal $T_2$, the STR signal is maintained at the output terminal $T_1$, or neither the STR signal nor the REC signal is maintained. In these cases, the other two circuits are prohibited from operating.

As is aforementioned, in the NV-DRAM device proposed by the applicant of the present invention in Japanese Patent Application No. 2-202958, once a recall operation is selected, the recall state is maintained until the recall/store latch circuit 10 as an internal recall latch circuit is reset by external control signals such as the $\overline{CE}$ signal, the $\overline{NE}$ signal, the $\overline{OE}$ signal and the $\overline{WE}$ signal.

In order to protect the data stored in the EEPROM section 1b by an unintentional store operation, it is required that the recall operation is performed for all the desired memory cells of the memory array 1 when the power is turned on.

In the above NV-DRAM device proposed by the applicant of the present invention, the recall state is maintained from the time when the recall/store latch circuit 10 is set by the power-on detection pulse $\phi_1$ detected by the power supply voltage monitoring circuit 12 until the recall/store latch circuit 10 is reset by the external control signals such as the $\overline{CE}$ signal. The recalled data does not appear in an output pad until the data is read out from the DRAM unit 1a.

In a system including a great number of such NV-DRAM devices, once the recall/store latch circuits 10 of the NV-DRAM devices are set when the power is turned on, the NV-DRAM devices performing the recall operation and the NV-DRAM devices performing the volatile mode operation (or the store operation) are both existent in the system until the recall/store latch circuits 10 of all the NV-DRAM devices are reset by the aforementioned external control signals.

In order to make such a system easier to use, it is preferable to have a construction in which the recall operation is performed for all the desired memory cells when the power is turned on, and the recall state is automatically released upon completion of the recall operation, whereby all the NV-DRAM devices in the system are put into the volatile operation mode. The following (1) and (2) are the reasons.

(1) Since DRAM devices have been used more widely than NV-DRAM devices, it is preferable to provide the NV-DRAM devices with a DRAM operation mode in terms of compatibility.

(2) In general, the recall operation and the volatile operations have different time periods for a cycle. Therefore, a system in which NV-DRAM devices have different operation modes is time-consuming and inefficient.

For the above-mentioned reasons, a conventional system including a plurality of NV-DRAM devices is limited concerning the ease of uses thereof.

SUMMARY OF THE INVENTION

A non-volatile dynamic random access memory device according to the present invention includes a memory section including at least non-volatile memory cells for a non-volatile mode operation which includes a recall operation and a store operation; and a rewriting device for rewriting data when power is turned on. The data is identical with data stored in the memory section.

In the case when a non-volatile dynamic random access memory device as mentioned above according to the present invention is used for a system in which the power is turned on and off at least once in several months such as a RAM disc of a portable personal computer, the recall operation is performed when the power is turned on and subsequently the store operation is performed. Thus, leak of charges from the floating gate of the non-volatile section is compensated for. Otherwise, there is an undesirable possibility that the store operation is not performed when the power is off. Since a period during which data is held in the non-volatile unit can remarkably be shortened in this way, the production yield and the reliability of data stored in the non-volatile unit can significantly be improved.

In a preferred embodiment of the present invention, the memory section includes only the non-volatile memory cells and is formed of a ferroelectric material. The non-volatile dynamic random access memory further includes a power-on detecting device for detecting that the power is turned on and for outputting an operation control signal, for controlling the non-volatile dynamic random access memory device to perform a refreshing operation for all the memory cells by the operation control signal; and a polarity rewriting device for rewriting a polarity of the ferroelectric material.

In the case when a non-volatile dynamic random access memory device as mentioned above according to the present invention is used for a system in which the power is turned on and off at least once in several months such as a RAM disc of a portable personal computer, the refreshing operation or the reading operation is performed for all the memory cells when the power is turned on. Thus, the polarity of the ferroelectric material which has an undesired possibility of being erased is rewritten. Charges leaked from the ferroelectric material of the non-volatile section can be compensated for.

In order to perform the reading operation, an internal address counter is provided as in a pseudo SRAM device, thereby eliminating the necessity for an external address input. Thus, the memory device is made easier to use. The internal address counter also allows for a refreshing operation although the refreshing operation is not absolutely necessary in the non-volatile operation mode.

In a preferred embodiment of the present invention, the non-volatile dynamic random access memory device further includes a latch circuit for storing a recall state; an identifying device for identifying a number of times by which the recall operation is repeated; and a reset device for resetting the latch circuit in accordance with an output from the identifying device.

According to a construction in which a number of times by which a recall operation is repeated is identified repetitively by an identifying device, thereby resetting the circuit in accordance with the identification result, a latch circuit can be reset without any external control signal.

Accordingly, in the case when a plurality of non-volatile dynamic random access memory devices as described above are incorporated into a system, the recall operation of all the memory devices are simultaneously set. Accordingly, the system does not simultaneously include memory devices performing the recall operation and memory devices performing a volatile mode operation (or a store operation). The system is thus made easier to use.

Thus, the invention described herein makes possible the advantages of providing (1) a non-volatile dynamic random access memory device which significantly improves the production yield and the data reliability; and (2) a non-volatile dynamic random access memory device which, when being incorporated into a system, makes the system easier to use.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrating examples with reference to the accompanying drawings.

Figure 11:
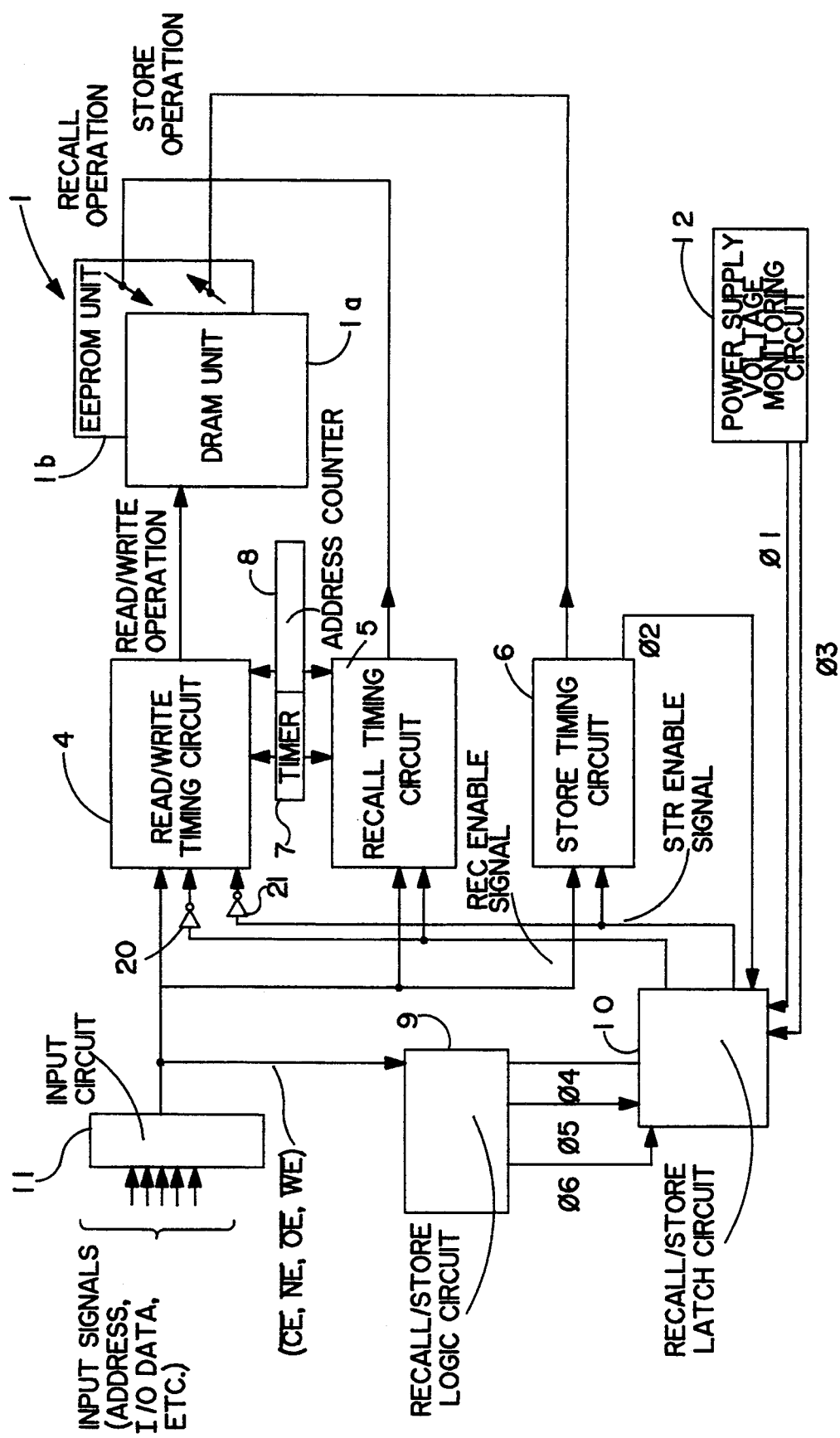
FIG. 11 is a block diagram illustrating an overall construction of an NV-DRAM device which has been proposed by the applicant of the present invention.
Figure 12:
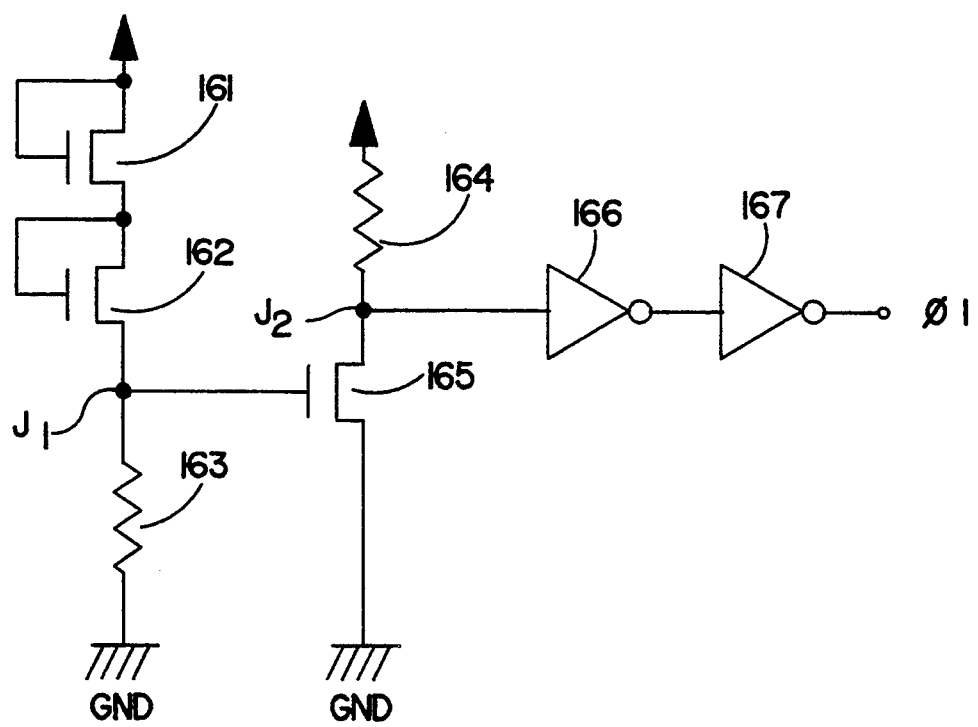
FIG. 12 is a circuit diagram of a power supply voltage monitoring circuit.

Since an overall construction of an NV-DRAM device according to the present invention is identical with the construction shown in FIG. 11, explanation thereof will be omitted. In the following description, elements corresponding to those in FIG. 11 bear identical reference numerals with those in FIG. 11.

EXAMPLE 1

Figure 1:
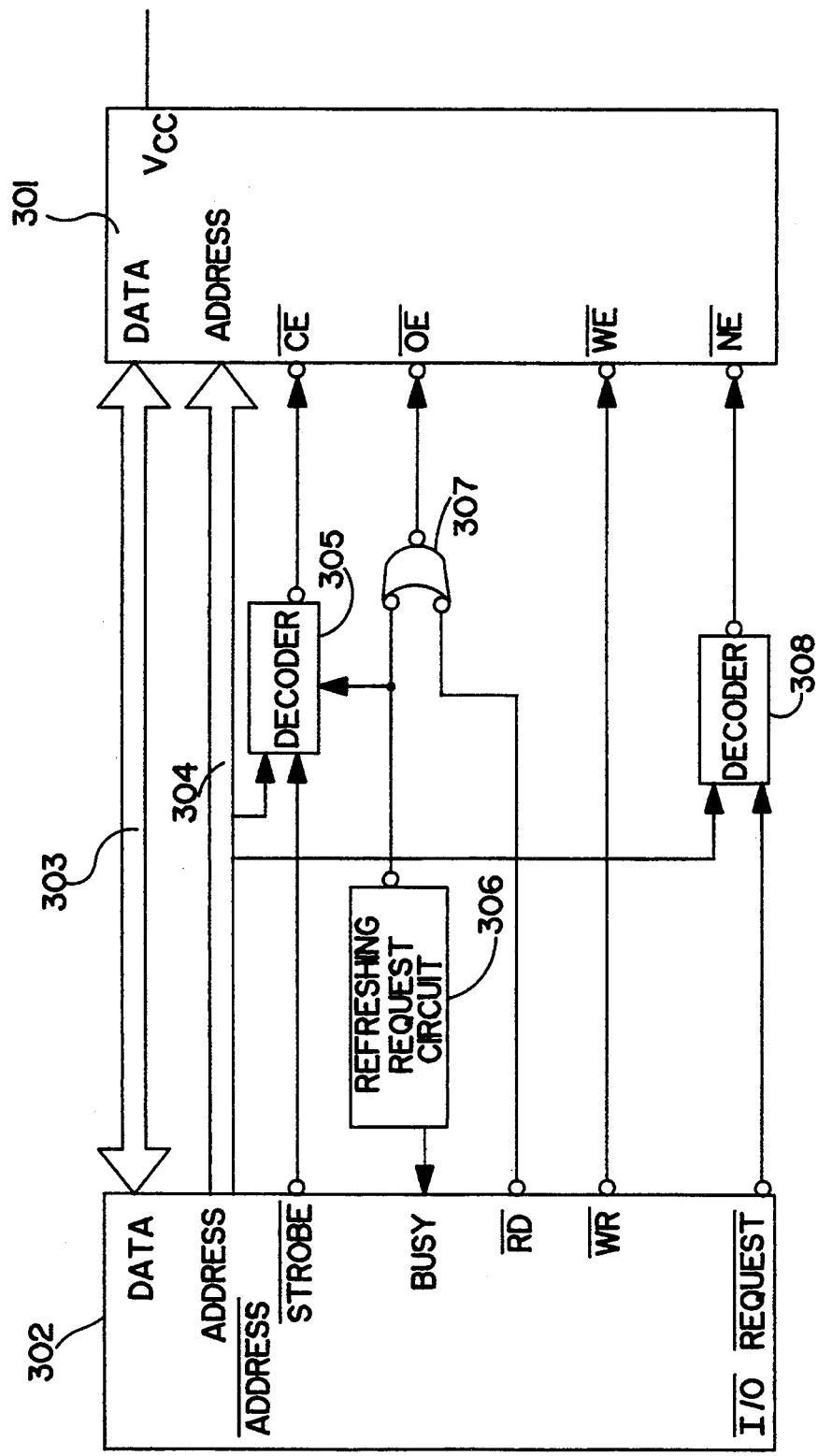
FIG. 1 is a block diagram of an NV-DRAM device having a volatile operation mode and a non-volatile operation mode according to the present invention in the state of being connected to a microprocessor.

FIG. 1 is a block diagram of an NV-DRAM device 301 having a volatile operation mode and a non-volatile operation mode according to a first example of the present invention in the state of being connected to a microprocessor 302.

As is shown in FIG. 1, the NV-DRAM device 301 includes, as input pins, a Vcc pin, a $\overline{CE}$ pin, an $\overline{OE}$ pin, a $\overline{WE}$ pin, and an $\overline{NE}$ pin. A usual memory operation and a non-volatile mode operation are performed by control signals sent to the input pins from the microprocessor 302.

The non-volatile mode operation includes a recall operation for transferring data from a non-volatile unit (for example, an EEPROM unit) to a volatile unit (for example, a DRAM unit) and a store operation for transferring data from the volatile section to the non-volatile section. The non-volatile mode operation is performed when a voltage is inputted to the Vcc, namely, when the power is turned on.

Hereinafter, operation of the NV-DRAM device 301 will be described with reference to FIG. 2.

When the power is turned on, a refreshing request instruction is sent from a refreshing request circuit 306 to the microprocessor 302, and then a BUSY flag is set in the microprocessor 302. The flag is set in order to switch the operation mode from the volatile mode to the non-volatile mode.

Figure 2:
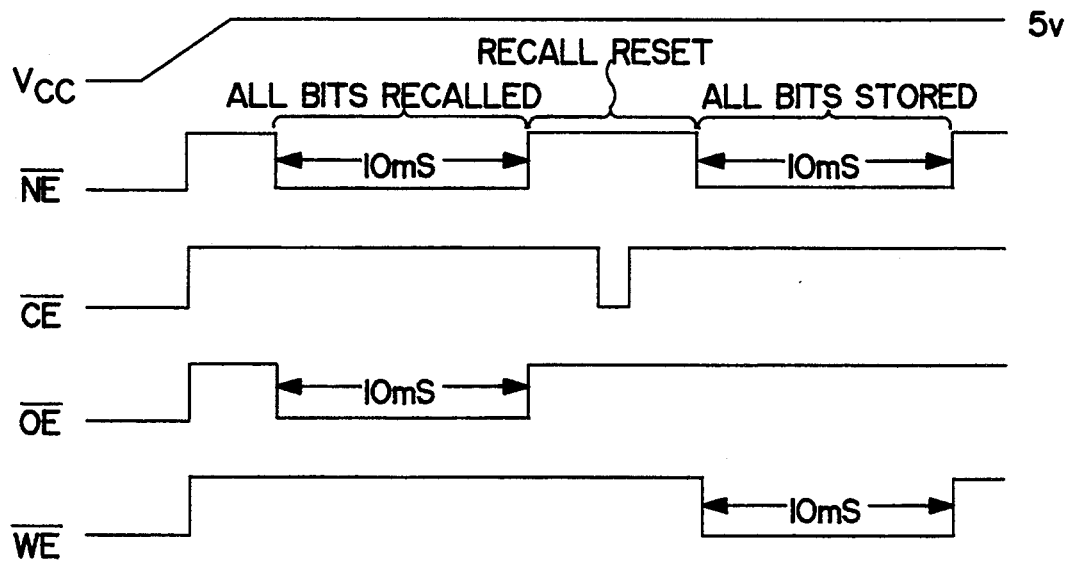
FIG. 2 is a timing chart for a recall operation performed after the power is turned on in the DRAM device shown in FIG. 1.

Subsequently, the microprocessor 302 sends an $\overline{NE}$ signal having a waveform as shown in FIG. 2 from an $\overline{I/O\ REQUEST}$ pin to the $\overline{NE}$ pin through a decoder 308, and also sends a $\overline{CE}$ signal having a waveform as shown in FIG. 2 from an $\overline{ADDRESS\ STROBE}$ pin to the $\overline{CE}$ pin through a decoder 305. By the $\overline{CE}$ signal, memory cells corresponding to address signals sent through an address bus 304 are sequentially selected.

Further, the microprocessor 302 sends an $\overline{OE}$ signal having a waveform as shown in FIG. 2 from an $\overline{RD}$ (data read) pin to the $\overline{OE}$ pin through a gate 307, and also sends a $\overline{WE}$ signal having a waveform as shown in FIG. 2 from a $\overline{WR}$ (data write) pin to the $\overline{WE}$ pin through the decoder 308. Data to be written in the memory cells are transferred through a data bus 303.

Practically, the recall operation and the store operation are performed at a timing shown in FIG. 2. When the $\overline{NE}$ signal is changed from HIGH (reset state) to LOW and the $\overline{OE}$ signal is changed from HIGH to LOW after the power is turned on, the recall operation for all the bits is initiated.

The recall operation is performed for 10 ms, during which time data is read out from all the memory cells. Accordingly, the $\overline{CE}$ signal is at the HIGH level. Since no data is written during this period, the $\overline{WE}$ signal is also at the HIGH level.

Upon completion of the recall operation for all the bits, the NV-DRAM device 301 in the recall state is reset. Then, when the $\overline{NE}$ signal is changed from HIGH to LOW and the $\overline{WE}$ signal is changed from HIGH to LOW, the store operation is initiated. The store operation is performed for 10 ms, during which time the $\overline{CE}$ signal is at the HIGH level, and the $\overline{WE}$ signal is at the LOW level. Since no data is read out during this period, the $\overline{OE}$ signal is at the HIGH level.

In the case when the NV-DRAM device according to the first example of the present invention is used for a system in which the power is turned on and off at least once in several months such as a RAM disc of a portable personal computer, the recall operation is performed when the power is turned on and subsequently the store operation is performed. Thus, leak of charges from the floating gate of the non-volatile section is compensated for. Since a period during which data is held in the non-volatile unit can remarkably be shortened in this way, the production yield and the reliability of data stored in the non-volatile unit can significantly be improved.

EXAMPLE 2

Figure 3:
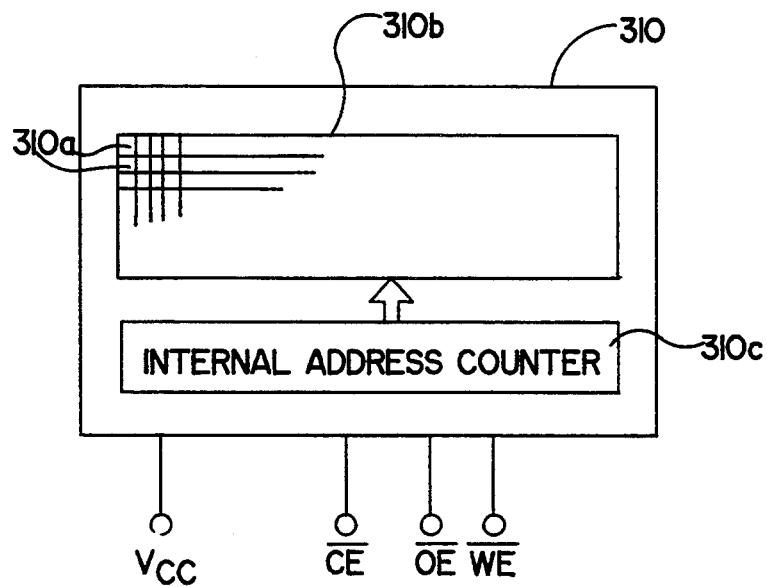
FIG. 3 is a block diagram of an NV-DRAM device having only a non-volatile operation mode according to the present invention.
Figure 4:
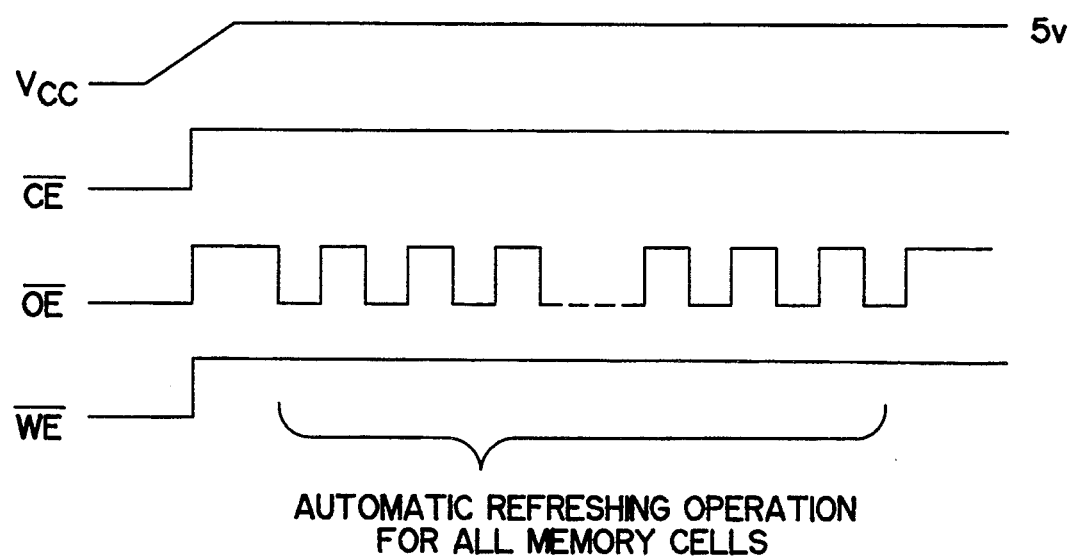
FIG. 4 is a timing chart for a rewriting operation of polarity of all the memory cells in the NV-DRAM device shown in FIG. 3 by an automatic refreshing operation using an internal address counter.

FIGS. 3 and 4 are directed to an NV-DRAM device 310 having only a non-volatile operation mode according to a second example of the present invention.

The NV-DRAM device 310 includes a memory section 310b having a plurality of memory cells 310a and an internal address counter 310c for generating an address signal for the memory section 310b. The memory cells 310a are formed of a ferroelectric material, and the non-volatile operation is performed by setting a polarity of the ferroelectric material.

As is shown in FIG. 3, the NV-DRAM device 310 further includes a Vcc pin, a $\overline{CE}$ pin, an $\overline{OE}$ pin, and a $\overline{WE}$ pin. The rewriting operation is performed at a timing shown in FIG. 4, in practice, by automatically refreshing data at all the bits sequentially using the internal address counter 310c.

When the power is turned on, the refreshing operation (operation utilizing automatic refreshing of a pseudo SRAM or a $\overline{CAS}$ before $\overline{RAS}$ refreshing operation) is performed for all the memory cells, thereby rewriting a polarity of the ferroelectric material forming the memory cells.

In the case when the NV-DRAM device according to the second example of the present invention is used for a system in which the power is turned on and off at least once in several months such as a RAM disc of a portable personal computer, the refreshing operation or the reading operation is performed for all the memory cells when the power is turned on. Thus, the polarity of the ferroelectric material is rewritten. Since a period during which data is held can remarkably be shortened in this way, the production yield and the reliability of data stored can significantly be improved.

EXAMPLE 3

Figure 5:
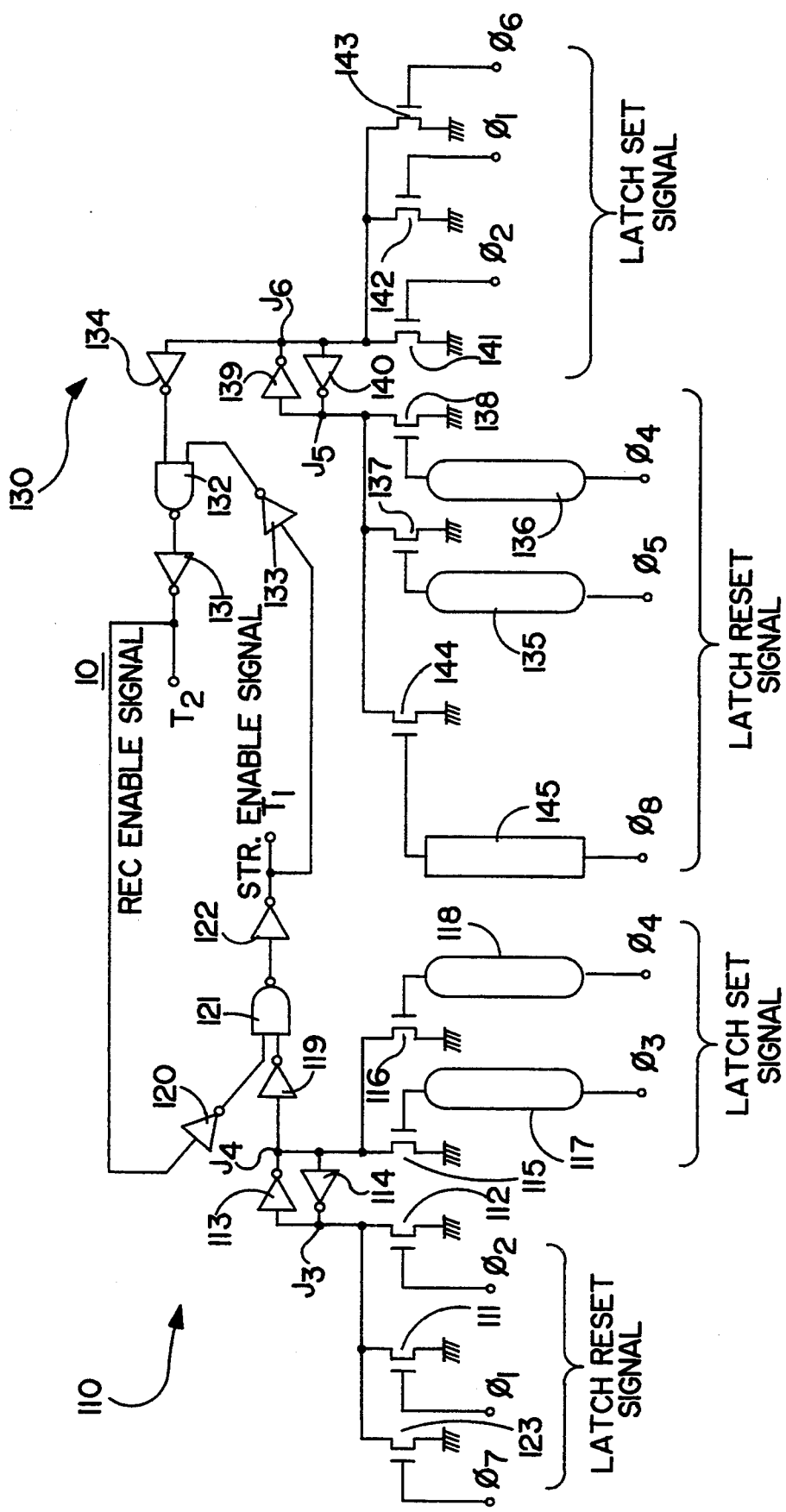
FIG. 5 is a circuit diagram of a recall/store latch circuit of an NV-DRAM device according to the present invention.
Figure 13:
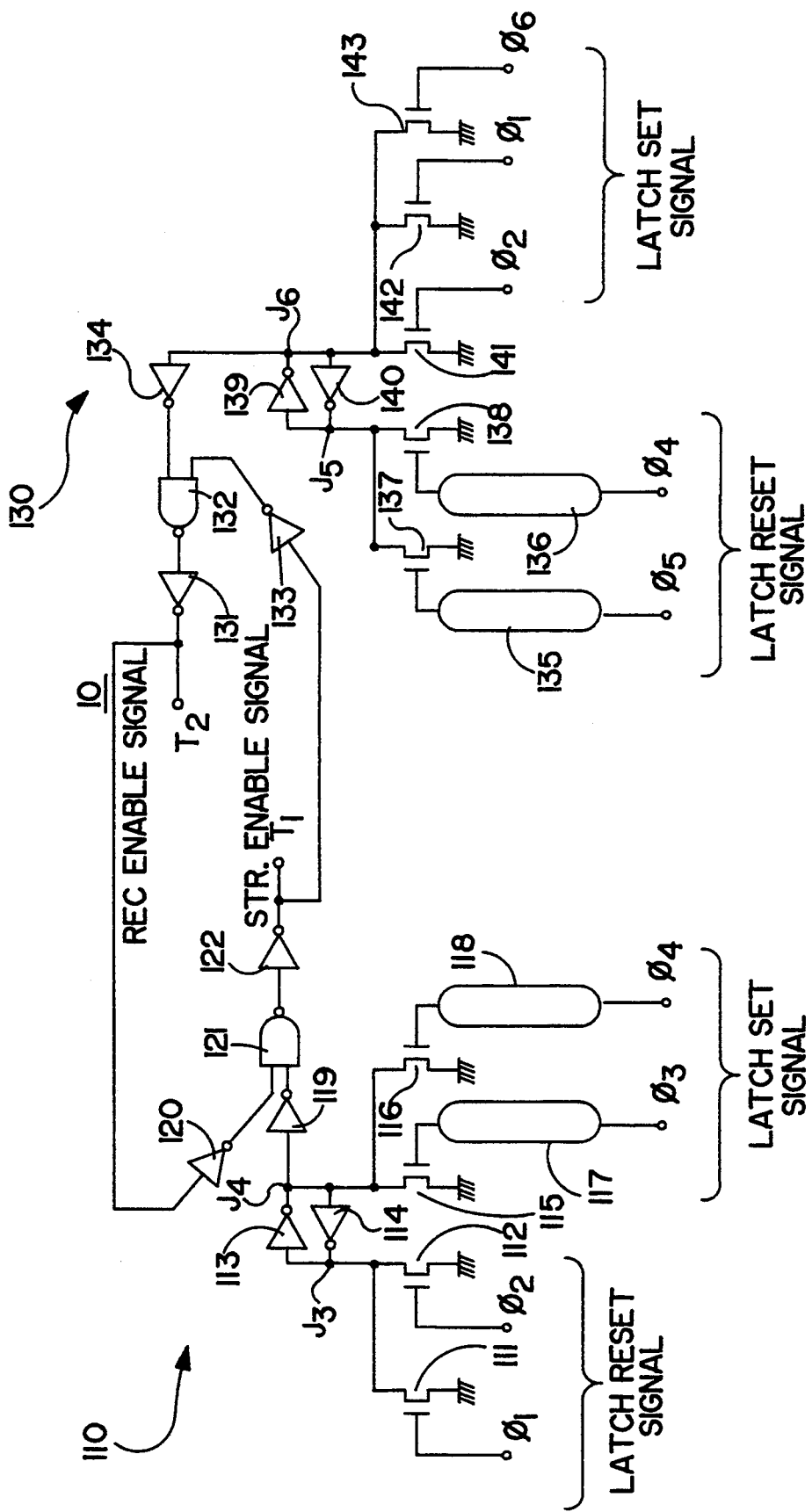
FIG. 13 is a circuit diagram of a recall/store latch circuit of the NV-DRAM device shown in FIG. 11.

FIG. 5 shows a recall/store latch circuit 10 of an NV-DRAM device according to a third example of the present invention. The recall/store latch circuit 10 includes NMOS transistors 123 and 144 and a pulse generating circuit 145 in addition to the configuration shown in FIG. 13. The elements corresponding to those in FIG. 11 bear identical reference numerals with those in FIG. 11. The NMOS transistor 123 is connected to the NMOS transistor 111 of the store latch section 110 in parallel, and the pulse generating circuit 145 is connected to the generating circuit 135 of the recall latch section 130 in parallel. An output pulse of the generating circuit 145 as a reset pulse is sent to a gate of an NMOS transistor 144 which is newly added for reset.

The generating circuit 145 usually applies a potential of the ground level to the gate of the NMOS transistor 144 as the generating circuits 135 and 136 do for the transistors 137 and 138. Upon receipt of a latch reset signal $\phi_8$ from an internal address counter 200 (described in detail later), the generating circuit 145 provides the gate of the transistor 144 with a potential of the Vcc level in a short pulse waveform, thereby resetting the recall/store latch circuit 10.

Figure 6:
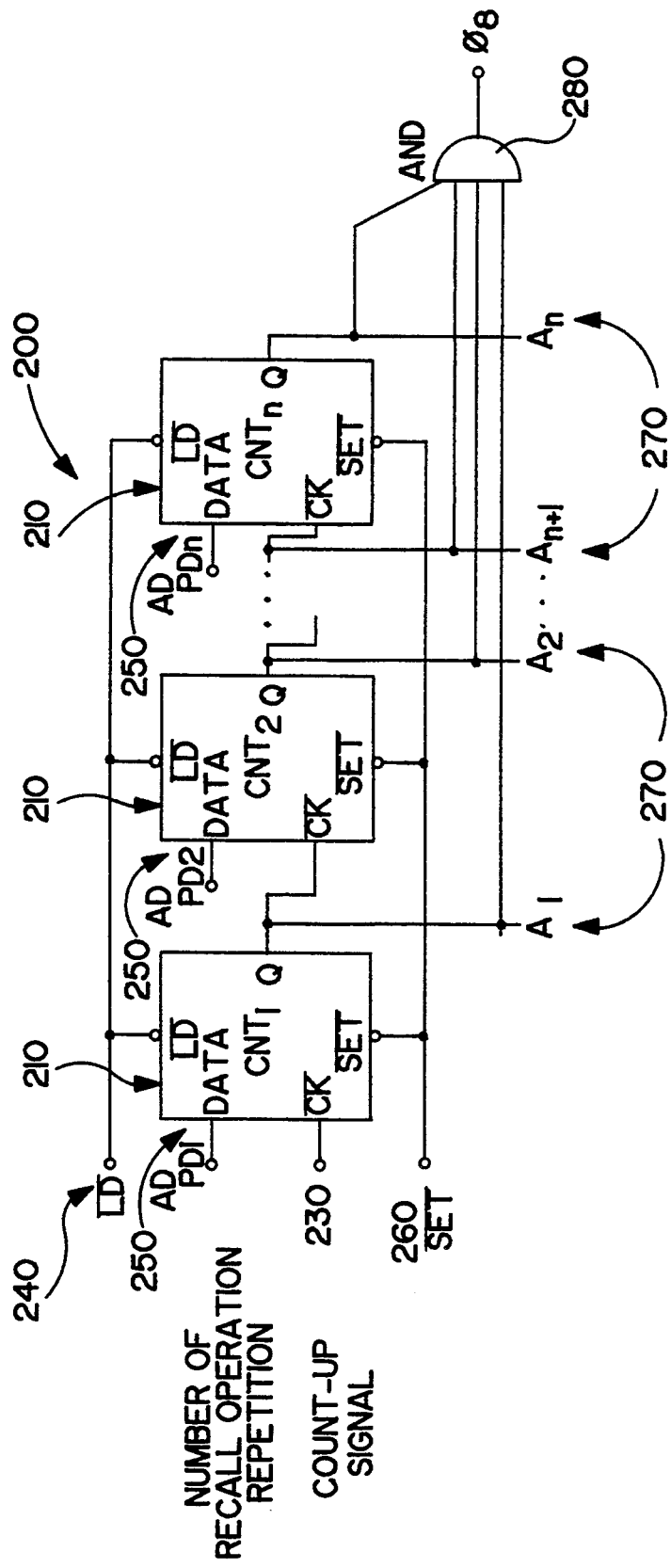
FIG. 6 is a circuit diagram of an internal address counter of the NV-DRAM device shown in FIG. 5.

FIG. 6 is a diagram of the internal address counter 200. The internal address counter 200 includes a plurality of load counters 210 ($CNT_1$ through $CNT_n$). In the internal address counter 200, an inverted signal of the power-on detection pulse $\phi_1$ is used as a reset signal. When the power is turned on, outputs of all the load counters 210 ($CNT_1$ through $CNT_n$) are reset to "0". Each time the recall operation is performed for each memory cell of the memory array 1, the load counters 210 ($CNT_1$ through $CNT_n$) are sequentially incremented. When the outputs of all the load counters 210 ($CNT_1$ through $CNT_n$) become "1", an output from an AND circuit 280 connected to the internal address counter 200 is changed from "0" to "1", and the above-mentioned output is sent to the pulse generating circuit 145 as the latch reset signal $\phi_8$ indicating that the recall/store latch circuit 10 is reset.

In other words, the internal address counter 200 identifies how many times the recall operation has been performed. Based on the output from the internal address counter 200, the recall/store latch circuit 10 is reset.

The internal address counter 200 will be described in detail, hereinafter.

As described above, the address counter 200 includes the load counters 210 ($CNT_1$ through $CNT_n$) connected in a cascade. In such a configuration, the address counter 200 constitutes an n-bit counter having outputs 270 ($A_1$ through $A_n$).

The load counters 210 each have an output Q, a data input pin DATA, a $\overline{CK}$ (clock input) pin, an $\overline{LD}$ (load signal input) pin, and a $\overline{SET}$ (set signal input) pin. The outputs Q from the load counters $CNT_1$ through $CNT_{n-1}$ are connected to the $\overline{CK}$ pins of the following counters $CNT_2$ through $CNT_n$, respectively, with an exception of the output from the load counter $CNT_n$ corresponding to a highest address.

In such a configuration, each time a count-up signal 230 is inputted to the $\overline{CK}$ pin, the outputs 270 ($A_1$ through $A_{-1}$) are incremented one by one. Each time an $\overline{LD}$ signal 240 becomes LOW, inputs 250 ($AD_{PD1}$ through $AD_{PDn}$) are loaded to the outputs 270 ($A_1$ through $A_n$), respectively. The outputs 270 ($A_1$ through $A_n$) are decoded, and when all the addresses become "1", the output from the AND circuit 280 is changed from "0" to "1". By setting a $\overline{SET}$ to LOW, the outputs 270 ($A_1$ through $A_n$) are set to logical 0.

According to the third example, when the power is turned on, the internal address counter 200 identifies whether the recall operation is repeated a specified number times or not. If it is confirmed that the recall operation is repeated the specified number of times, the latch reset signal $\phi_8$ generated in the internal address counter 200 is sent to the pulse generating circuit 145, thereby resetting the reset/store latch circuit 10. Accordingly, all the desired memory cells are recalled after the power is turned on, and upon the completion of the recall operation, the recall/store latch circuit 10 is automatically reset. Therefore, in a system including a plurality of such NV-DRAM devices, there is no need for resetting each recall/store latch circuit 10 by external control signals such as $\overline{CE}$ signals as in the case of a conventional device, thereby making the system significantly easier to use.

Figure 7:
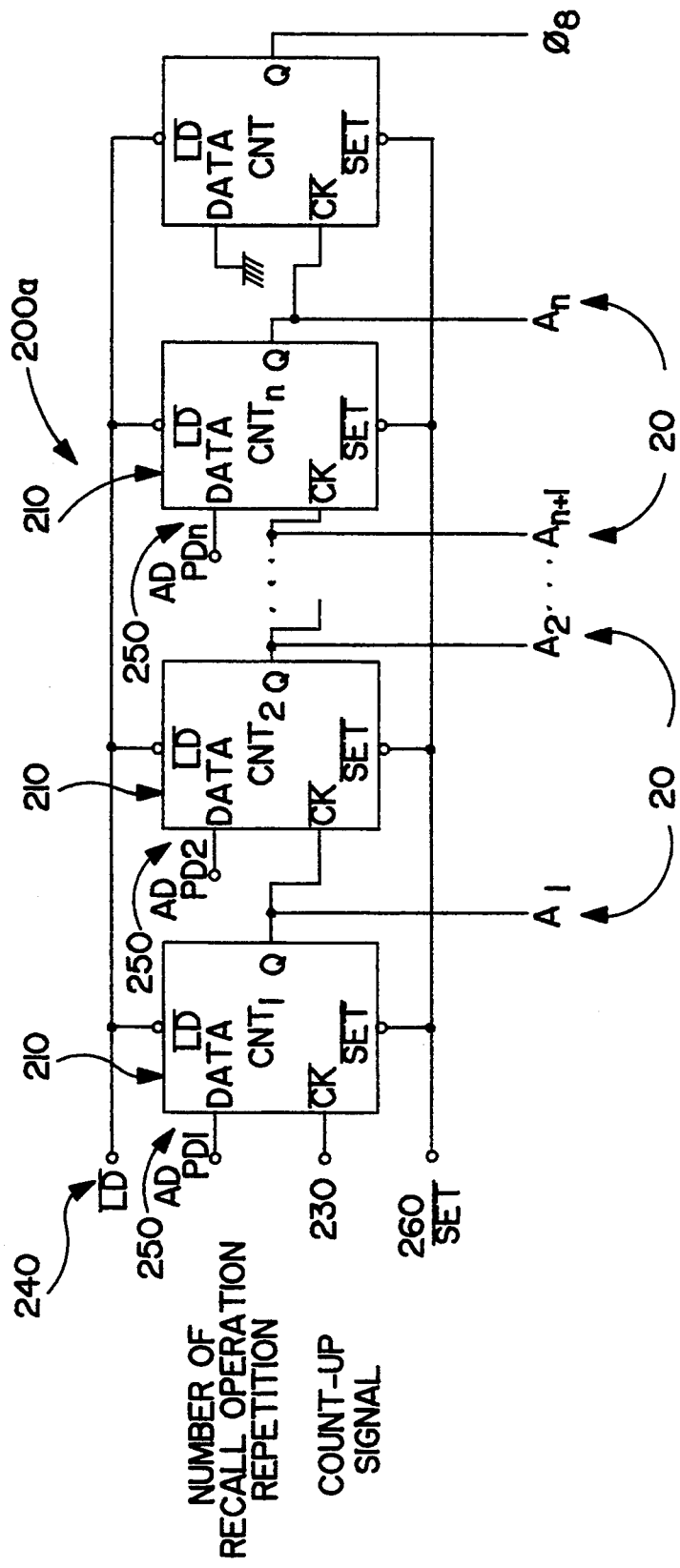
FIG. 7 is a circuit diagram of another internal address counter of an NV-DRAM device according to the present invention.

FIG. 7 shows an internal address counter 200a as a modification of the internal address counter 200 according to the third example. Elements corresponding to those in FIG. 6 bear identical reference numerals with those in FIG. 6. The internal address counter 200a according to the modification includes another load counter $CNT_{n+1}$ in addition to the load counters $CNT_1$ through $CNT_n$. When the output from the load counter $CNT_{n+1}$ (corresponding to a highest address) becomes from "0" to "1", namely, when the all the addresses "00H" to "FFH" are counted by the internal address counter 200a, the recall operation for all the bits is completed. Then, the internal address counter 200a is incremented, when the recall/store latch circuit 10 is reset.

In the internal address counter 200a, an inverted signal of the power-on detection pulse $\phi_1$ is used as a reset signal. When the power is turned on, the load counters $CNT_1$ through $CNT_{n+1}$ are reset to "0". Each time the recall operation is performed, the internal address counter 200a is incremented. When the output from the load counter $CNT_{n+1}$ becomes "1" from "0", the recall/store latch circuit 10 is reset.

Figure 8:
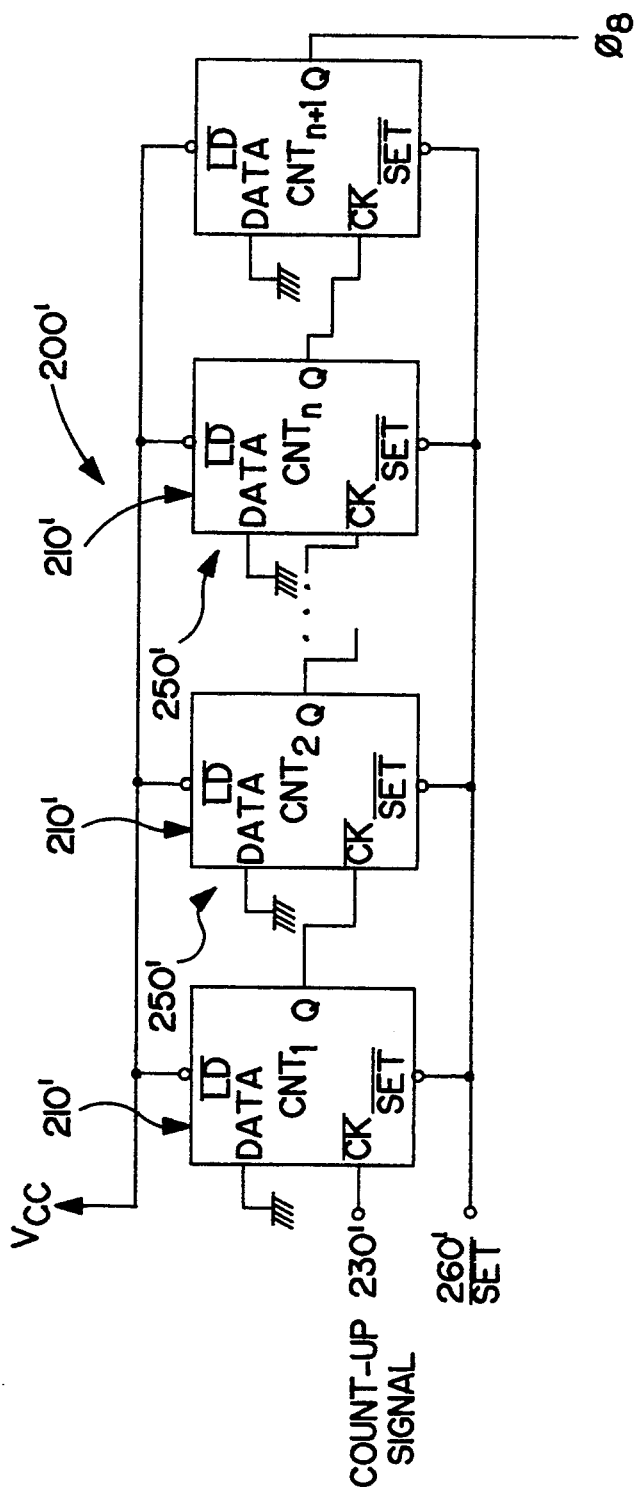
FIG. 8 is a circuit diagram of still another internal counter of an NV-DRAM device according to the present invention.
Figure 9:
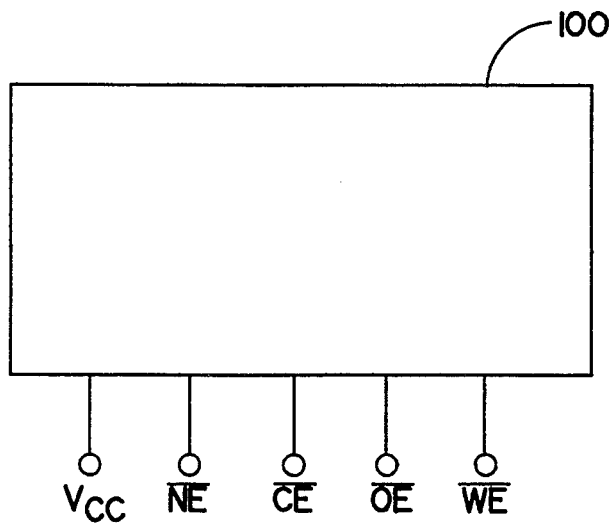
FIG. 9 is a block diagram of a conventional NV-DRAM device having a volatile operation mode and a non-volatile operation mode.
Figure 10:
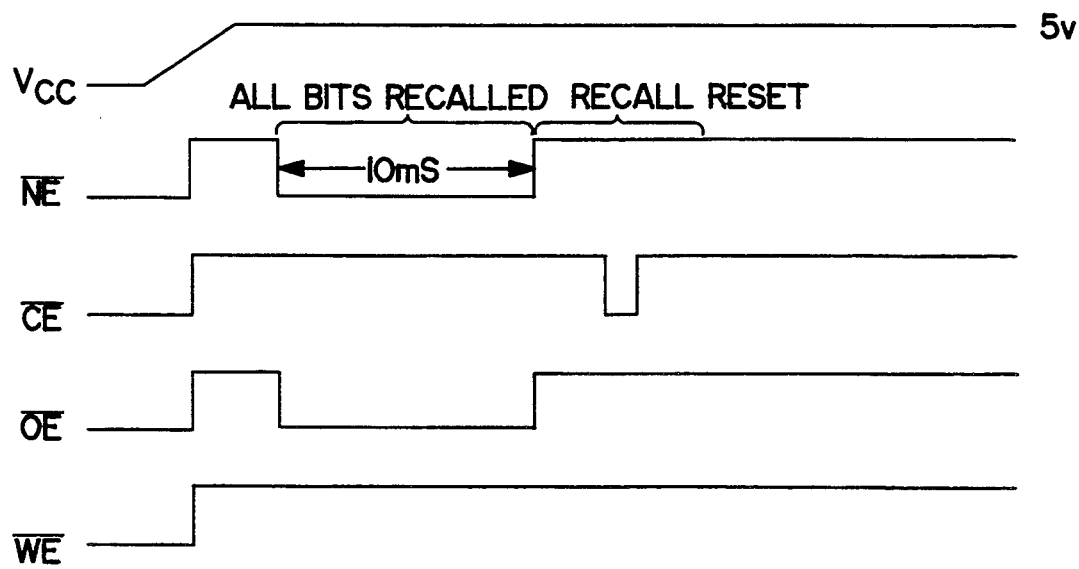
FIG. 10 is a timing chart for a recall operation for all bits of the conventional NV-DRAM device shown in FIG. 9.

FIG. 8 shows another internal address counter 200' which is combined with the internal address counter 200. Elements corresponding to those in FIG. 6 bear corresponding reference numerals with "'" with those in FIG. 6. The internal address counter 200' includes a plurality of load counters 210'. Each load counter 210' counts itself how many times the recall operations has been performed. An inverted signal of the power-on detection pulse $\phi_1$ is used as a reset signal. When the power is turned on, the load counters $CNT_1$ through $CNT_{n+1}$ are reset to "0". Each time the recall operation is performed, the internal address counter 200' is incremented. When all the addresses "00H" through "FFH" are counted by the internal address counter 200 in FIG. 6, the output from the internal address counter 200' is changed from "0" to "1", thereby resetting the recall/store latch circuit 10.

As has been described so far, in an NV-DRAM device according to the present invention, a recall operation is automatically reset after the power is turned on. Therefore, a system including such an NV-DRAM device is much easier to use than a system including the conventional NV-DRAM device.

In a non-volatile dynamic random access memory device according to the present invention, a function of the recall operation and a function of the store operation can be incorporated into an integrated circuit or performed by control signals from a microprocessor.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile dynamic random access memory device, comprising:
    a memory section including non-volatile memory cells for a non-volatile mode operation which includes a recall operation and a store operation, and including volatile memory cells for a volatile mode operation; and
    rewriting means for rewriting data when power is turned on, the data being identical with data stored in the memory section, the rewriting means comprising:
    power-on detecting means for detecting that the power is turned on and for outputting an operation mode switching signal, for putting the non-volatile dynamic random access memory into a non-volatile operation mode by the switching signal, and
    operation control means for performing a recall operation for a specified area of the memory cells in response to the operation mode switching signal and subsequently performing a store operation for the specified area of the memory cells.

2. A non-volatile dynamic random access memory device according to claim 1, wherein the non-volatile dynamic random access memory device is put into the non-volatile operation mode, and the recall operation and the store operation are performed by an external instruction signal.

3. A non-volatile dynamic random access memory device, comprising:
    a memory section including only non-volatile memory cells for a non-volatile mode operation which includes a recall operation and a store operation; and
    rewriting means for rewriting data when power is turned on, the data being identical with data stored in the memory section,
    wherein the memory section is formed of a ferroelectric material, the non-volatile dynamic random access memory device further comprising:
    power-on detecting means for detecting that the power is turned on and for outputting an operation control signal, for controlling the non-volatile dynamic random access memory device to perform a refreshing operation for all the memory cells by the operation control signal; and
    polarity rewriting means for rewriting a polarity of the ferroelectric material.

4. A non-volatile dynamic random access memory device, comprising:
    a memory section including at least non-volatile memory cells for a non-volatile mode operation which includes a recall operation and a store operation; and
    rewriting means for rewriting data when power is turned on, the data being identical with data stored in the memory section;
    wherein the non-volatile memory section is formed of a ferroelectric material, the non-volatile dynamic random access memory device further comprising:
    power-on detecting means for detecting that the power is turned on and for outputting an operation control signal, for controlling the non-volatile dynamic random access memory device to perform a reading operation for all the memory cells by the operation control signal; and polarity rewriting means for rewriting a polarity of the ferroelectric material.

5. A non-volatile dynamic random access memory device according to claim 3, further comprising internal address outputting means for outputting an address data for the refreshing operation.

6. A non-volatile dynamic random access memory device according to claim 3, further comprising:

a latch circuit for storing a recall state;

identifying means for identifying a number of times by which the recall operation is repeated; and reset means for resetting the latch circuit in accordance with an output from the identifying means.

7. A non-volatile dynamic random access memory device according to claim 4, further comprising:

a latch circuit for storing a recall state;

identifying means for identifying a number of times by which the recall operation is repeated; and reset means for resetting the latch circuit in accordance with an output from the identifying means.

8. A non-volatile dynamic random access memory device according to claim 6, wherein the identifying means is reset in accordance with an output from the power-on detecting means when the power is turned on.

9. A non-volatile dynamic random access memory device according to claim 7, wherein the identifying means is reset in accordance with an output from the power-on detecting means when the power is turned on.

10. A non-volatile dynamic random access memory device according to claim 6, wherein the identifying means is an internal address counter.

11. A non-volatile dynamic random access memory device according to claim 7, wherein the identifying means is an internal address counter.

* * * * *